United States Patent [19]
Hashimoto et al.

[11] Patent Number: 5,946,168
[45] Date of Patent: Aug. 31, 1999

[54] MAGNETO-RESISTANCE EFFECT DEVICE AND MAGNETIC HEAD

[75] Inventors: Minoru Hashimoto; Nobuhiro Sugawara; Toshihiko Yaoi, all of Kanagawa; Hiroshi Kano, Miyagi, all of Japan

[73] Assignee: Sony Corporation, Tokyo, Japan

[21] Appl. No.: 08/823,899

[22] Filed: Mar. 25, 1997

[30] Foreign Application Priority Data

Mar. 26, 1996 [JP] Japan .................................. P08-070018

[51] Int. Cl.$^6$ ...................................................... G11B 5/39
[52] U.S. Cl. ................................................................ 360/113
[58] Field of Search ............................................. 360/113

[56] References Cited

U.S. PATENT DOCUMENTS

| | | | |
|---|---|---|---|
| 5,021,909 | 6/1991 | Shiiba ...................................... | 360/113 |
| 5,218,497 | 6/1993 | Tanabe et al. ........................... | 360/113 |
| 5,270,893 | 12/1993 | Sasaki et al. ............................ | 360/113 |
| 5,402,292 | 3/1995 | Komoda et al. ......................... | 360/113 |
| 5,412,524 | 5/1995 | Nagata et al. ........................... | 360/113 |
| 5,434,826 | 7/1995 | Ravipati et al. ..................... | 360/113 X |
| 5,485,334 | 1/1996 | Nix et al. ................................ | 360/113 |
| 5,532,584 | 7/1996 | Jeffers et al. ........................... | 324/202 |
| 5,585,985 | 12/1996 | Nagata et al. ........................... | 360/113 |
| 5,671,105 | 9/1997 | Sugawara et al. ....................... | 360/113 |
| 5,736,060 | 4/1998 | George et al. ...................... | 360/113 X |
| 5,737,155 | 4/1998 | George et al. ........................... | 360/113 |
| 5,737,156 | 4/1998 | Bonyhard ................................ | 360/113 |

*Primary Examiner*—William J Klimowicz
*Attorney, Agent, or Firm*—Hill & Simpson

[57] ABSTRACT

A magneto-resistance effect device (MR device) in which stable magneto-resistance characteristics may be achieved even if a layer of a soft magnetic material is reduced in width. The MR device includes a layer of a soft magnetic material 1, a rear end electrode 4, connected to one longitudinal end of the layer of a soft magnetic material 1, and a forward end electrode 5 connected to the opposite end of the soft magnetic material 1. On both ends of the layer of the soft magnetic material 1 are arranged magnetic domain stabilizers 2, 3 generating a bias magnetic field having a component parallel to the direction of width of the layer of a soft magnetic material 1. If the bias magnetic field sufficient to overcome the longitudinal magnetostatic anisotropy can be impressed, the direction of magnetization $D_f$ of the mono-layer soft magnetic material 1 is oriented in the direction of width. The electrical resistance of the magnetic domain stabilizers 2, 3 is selected to be larger than that of the soft magnetic material 1 for suppressing loss of the sense current i. The MR device 10 can be applied with advantage to a so-called vertical type MR head.

20 Claims, 17 Drawing Sheets

MAGNETO-RESISTANCE EFFECT DEVICE AND MAGNETIC HEAD

BACKGROUND OF THE INVENTION

1. Field of the Invention

This invention relates to a magneto-resistance effect device employing a mono-layer soft magnetic material and a magnetic head.

2. Description of the Related Art

Up to now, a magneto-resistance effect device employing a magnetic layer exhibiting magneto-resistance effect (MR device) is used in a magnetic sensor, a magnetic head, a rotation detection device or a position detection device, for detecting the magnetic field.

FIG. 1 shows the structure of the simplest MR device 110. This MR device 110 is comprised of a mono-layer soft magnetic material 101 of a width W and a length L with its easy axis of magnetization $D_e$ lying parallel to the width, and electrodes, not shown, are arranged on both longitudinal ends of the soft magnetic material 101. In such MR device 110, changes in resistance of the soft magnetic material 101 should be produced by an external magnetic field $H_{ext}$, which should be detected as changes in voltage across the electrodes by flowing the sense current i across the electrodes.

However, measurement of magnetization on impression of the external magnetic field $H_{ext}$ from a direction parallel to the longitudinal direction across the MR device 110 reveals that significant hysteresis is produced, as indicated in FIG. 2. On the other hand, measurement of the electrical resistance indicates no changes in resistance with the external magnetic field Hext, as indicated in FIG. 3. This is ascribable to the fact that, since the magneto-static anisotropy of the soft magnetic material 101 in the longitudinal direction exceeds the physical magnetic anisotropy in a direction along the easy axis $D_e$, the direction of magnetization $D_f$ of the soft magnetic material 101 cannot be oriented along the easy axis $D_e$.

Consequently, for applying such MR device to, for example, the magnetic head, the direction of the external magnetic field $H_{ext}$, which, in this case, is the signal magnetic field, is designed so as to be parallel to the easy axis $D_e$ of the soft magnetic material. In the following description, a magnetic head in which the MR device is arranged so that the direction of the easy axis $D_e$ of the soft magnetic material will be perpendicular to the direction of the external magnetic field $H_{ext}$ is termed the vertical type MR head, while a magnetic head in which the MR device is arranged so that the direction of the easy axis $D_e$ of the soft magnetic material will be parallel to the direction of the external magnetic field $H_{ext}$ is termed the horizontal type MR head. In the above-described horizontal type MR head, limitations are imposed on reducing the track width because the track width is determined by the electrode-to-electrode distance.

For constructing the vertical type MR head in which the track width is determined by the width of the soft magnetic material and in which the direction of magnetization of the soft magnetic material can be oriented in the direction of easy axis De, such an MR device has been devised in which two layers of a soft magnetic material are layered with the interposition of a non-magnetic layer. This MR device 120 is made up of a first layer of a soft magnetic material 102 and a second layer of a soft magnetic material 103, layered together with the interposition of a non-magnetic layer, not shown, with a pair of electrodes, not shown, being attached to both longitudinal ends of the soft magnetic layers 102, 103, as shown in FIG. 4.

With the MR device 120, the direction of magnetization $D_f$ of the two soft-magnetic layers 102, 103 can be oriented in the direction of the easy axis $D_e$ by exploiting the facts that the directions of magnetization $D_f$ are affected by the magnetostatic interaction between the two soft-magnetic layers 102, 103 and that a magnetic field due to the electric current Hi in a pre-set direction is generated within the two soft-magnetic layers 102, 103 by the sense current i flowing between the electrodes. With the above-described structure of the MR device 120, the external magnetic field $H_{ext}$ from a direction perpendicular to the easy axis $D_e$ also causes rotation of the direction of magnetization $D_f$ of the two soft-magnetic layers 102, 103, thus producing changes in resistance.

However, measurement of the magnetization on application of the external magnetic field $H_{ext}$ from a direction perpendicular to the direction of easy axis $D_e$ across the MR device 120 reveals that such application of the external magnetic field gives only a magnetization curve exhibiting hysteresis, as shown in FIG. 5. The electrical resistance is as shown in FIG. 6. It should be noted that the characteristics shown in FIGS. 5 and 6 are those for the width of each of the soft magnetic layers 102, 103 equal to 2.5 m, and that, if this width is reduced, both the magnetization curve and the resistance curve exhibit more acute hysteresis. For example, the resistance curve for the widths of the soft magnetic layers 102, 103 of 0.5 m exhibit significant hysteresis, as indicated in FIG. 7.

The above-described phenomenon is brought about by the difference in area between the first layer 102 and the second layer 103, as shown in FIG. 8 showing the cross-section of the MR device 120. In patterning the layered assembly made up of the first magnetic layer 102, non-magnetic layer 104 and the second soft magnetic layer 103, it is extremely difficult to etch the assembly to a vertical cross-section, such that both lateral sides of the etched layered assembly are inclined at a pre-set angle θ less than 90°.

If, in the MR device 120, there is produced a difference in width between the soft magnetic layers 102, 103, there is produced a significant difference in the magnitude of the magnetic fields produced by the magnetic poles on end faces of the soft magnetic layers 102, 103. The result is that, even in the absence of the external magnetic field $H_{ext}$, the direction of magnetization $D_f$ in the soft magnetic layers 102, 103 cannot be oriented in the direction of the easy axis $D_e$. The reason such phenomenon becomes outstanding with the decreased width of the MR device 120 is that the narrower the widths of the soft magnetic layers 102, 103 , the more difficult it becomes to override the difference in the widths of the two layers 102, 103.

SUMMARY OF THE INVENTION

It is therefore an object of the present invention to provide an MR device and a MR head in which a stable magnet-resistance effect may be realized even if the soft magnetic material is reduced in width.

According to the present invention, there is provided a magneto-resistance effect device having a soft magnetic material having a first electrode connected to one longitudinal end of the soft magnetic material, a second electrode connected to the other longitudinal end of the soft magnetic material and a magnetic domain stabilizer arranged on each side in a direction along the width of the soft magnetic material for generating a bias magnetic field having a component parallel to the direction of width of the soft magnetic material.

The bias magnetic field includes an exchange bias magnetic field.

If the magnetic domain stabilizer has a sufficiently large coercivity, magnetization of the magnetic domain stabilizer and that of the soft magnetic material are ferromagnetically combined in an area of the magnetic domain stabilizer neighboring to the soft magnetic material, so that the direction magnetization $D_f$ of the soft magnetic material is oriented in the same direction as the direction of magnetization of $D_p$ of the magnetic domain stabilizer. If the bias magnetic field sufficient to overcome the longitudinal magneto-static anisotropy can be impressed, the direction of magnetization $D_f$ of the mono-layer soft magnetic material is oriented in the direction of width. If the direction of the easy axis $D_e$ of the soft magnetic material is set to the direction of width, the direction of magnetization $D_f$ of the mono-layer soft magnetic material may be oriented to the direction of width. However, if a sufficient bias magnetic field can be impressed, there is no necessity of setting the direction of the easy axis $D_e$ to the direction of width.

If the direction of magnetization $D_f$ of the mono-layer soft magnetic material can be oriented in the direction of width, in accordance with the present invention, the distribution of magnetization of the soft magnetic material is stabilized to a state of a sole magnetic domain, thus assuring stable magneto-resistance characteristics of the MR device free of hysteresis.

If arranged symmetrically relative to the centerline parallel to the longitudinal direction of the soft magnetic material, on both ends in the direction of width thereof, the magnetic domain stabilizer can be arranged at any position between one end and the opposite end of the soft magnetic material. If the magnetic domain stabilizer is arranged continuously from one end to the opposite end of the soft magnetic material, the magnetic domain can be stabilized for the entire soft magnetic material.

However, if the magnetic domain stabilizer is contacted with both ends of the soft magnetic material, there is a risk of the sense current flowing in the magnetic domain stabilizer when the sense current is caused to flow between the first and second electrodes. Since the leakage current cannot detect magneto-resistance, the magneto-resistance ratio of the soft magnetic material is reduced in an amount corresponding to the loss in the current in the soft magnetic material due to the leakage current. For suppressing the current loss, the magnetic domain stabilizer is preferably arranged on one end or on both ends only in the longitudinal direction of the soft magnetic material for effectively avoiding contact of the magnetic domain stabilizer with the soft magnetic material in an area of the soft magnetic material between the first and second electrodes operating substantially as the magnetically sensitive portion.

The current loss may also be suppressed by selecting the electrical resistance of the magnetic domain stabilizer to be larger than that of the soft magnetic material. If, in this case, the magnetic domain stabilizer is contacted with the area of the soft magnetic material operating substantially as the magnetically sensitive area, current loss can be suppressed because the majority of the current then flows in the soft magnetic material.

The current loss may also be suppressed by interposing an insulator between the magnetic domain stabilizer and the soft magnetic material. However, the current loss is incurred even in such case if the magnetic domain stabilizer is contacted with both the first and second electrodes. Therefore, at least one of the first and second electrodes needs to be out of contact with the magnetic domain stabilizer. With such structure, current loss is scarcely incurred if the magnetic domain stabilizer is arranged in the entire area from one longitudinal end to the opposite longitudinal end of the soft magnetic material.

The magnetic domain stabilizer may be enumerated by a film of a hard magnetic material, a layered film of a soft magnetic material and a hard magnetic material, a film of an anti-ferromagnetic material and a layered film of a soft magnetic material and an anti-ferromagnetic material. In any case, the direction of magnetization $D_f$ of the mono-layer soft magnetic material can be aligned with the direction of magnetization of $D_p$ of the magnetic domain stabilizer.

The above-described MR device can be applied with advantage to the vertical type MR head. In this case, the MR device is sandwiched between the magnetic shields so that the longitudinal direction of the soft magnetic material will be perpendicular to the signal recording surface of the magnetic recording medium. If the MR device is applied to the vertical type MR head, the magnetic domain stabilizer is preferably arranged for extending from an end of the soft magnetic material facing the facing surface to the magnetic recording medium towards rear by a length longer than the length corresponding to the distance between the magnetic shields (magnetic gap g).

According to the present invention, the magnetic domain can be controlled appropriately even for a soft magnetic material of an extremely narrow width. Consequently, superior magneto-resistance characteristics can be realized with an MR device of a simplified structure employing a mono-layer soft magnetic material.

If the MR device is applied to a magnetic head, the Barkhausen noise can be suppressed to enable optimum signal reproduction.

DESCRIPTION OF THE PREFERRED EMBODIMENTS

Figure 1:
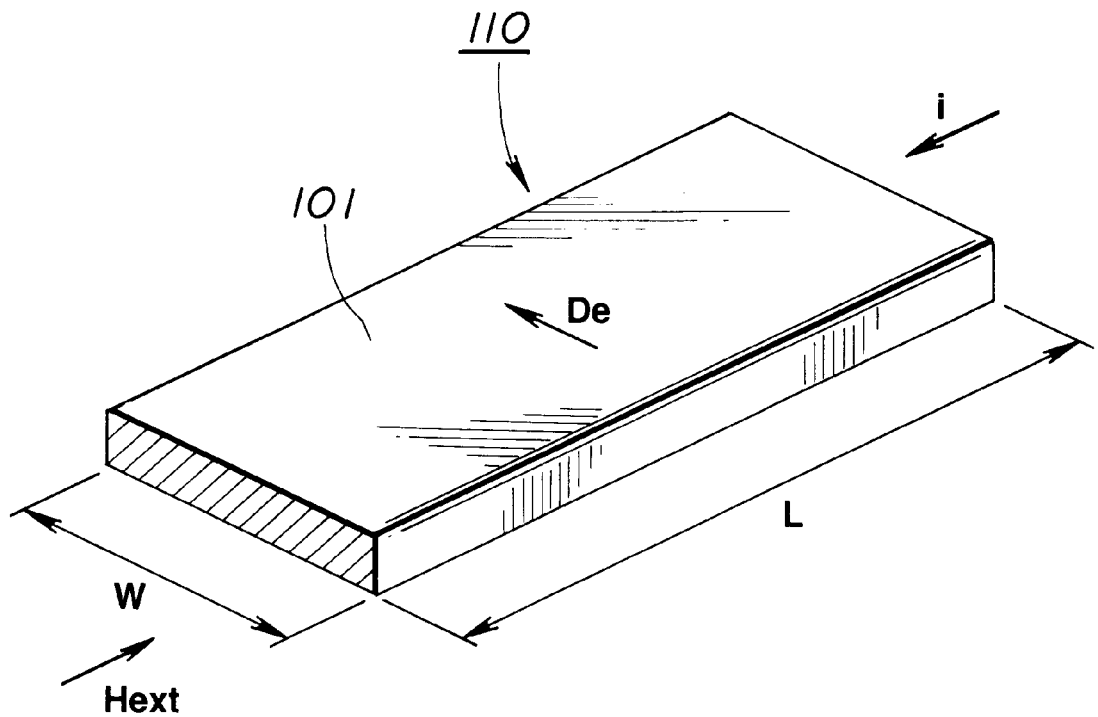
FIG. 1 is a perspective view showing essential parts of a conventional MR device.
Figure 2:
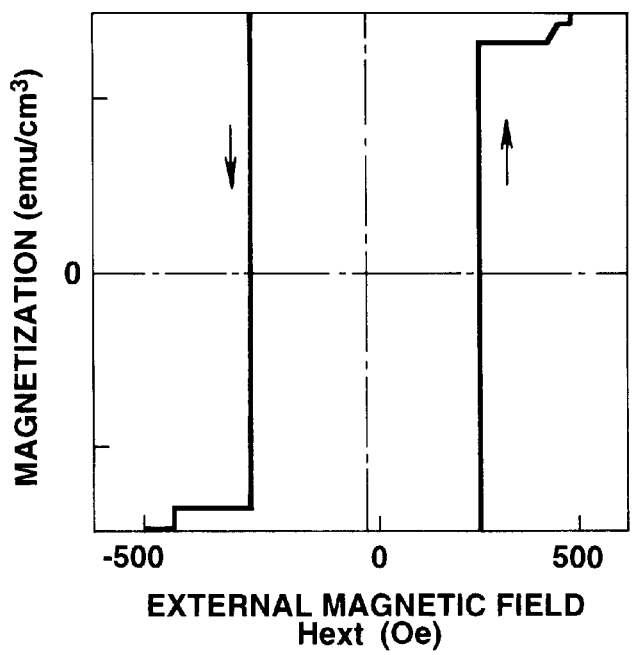
FIG. 2 is a graph showing a magnetization curve of the MR device shown in FIG. 1.
Figure 3:
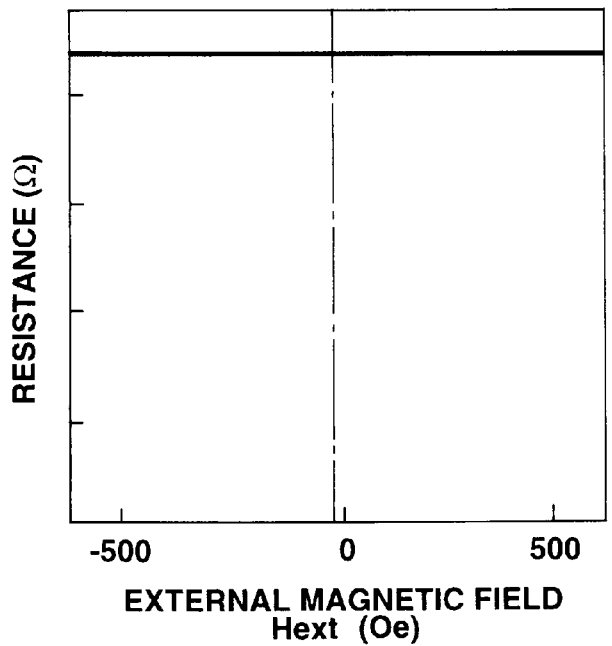
FIG. 3 is a graph showing a magneto-resistance curve of the MR device shown in FIG. 1.
Figure 4:
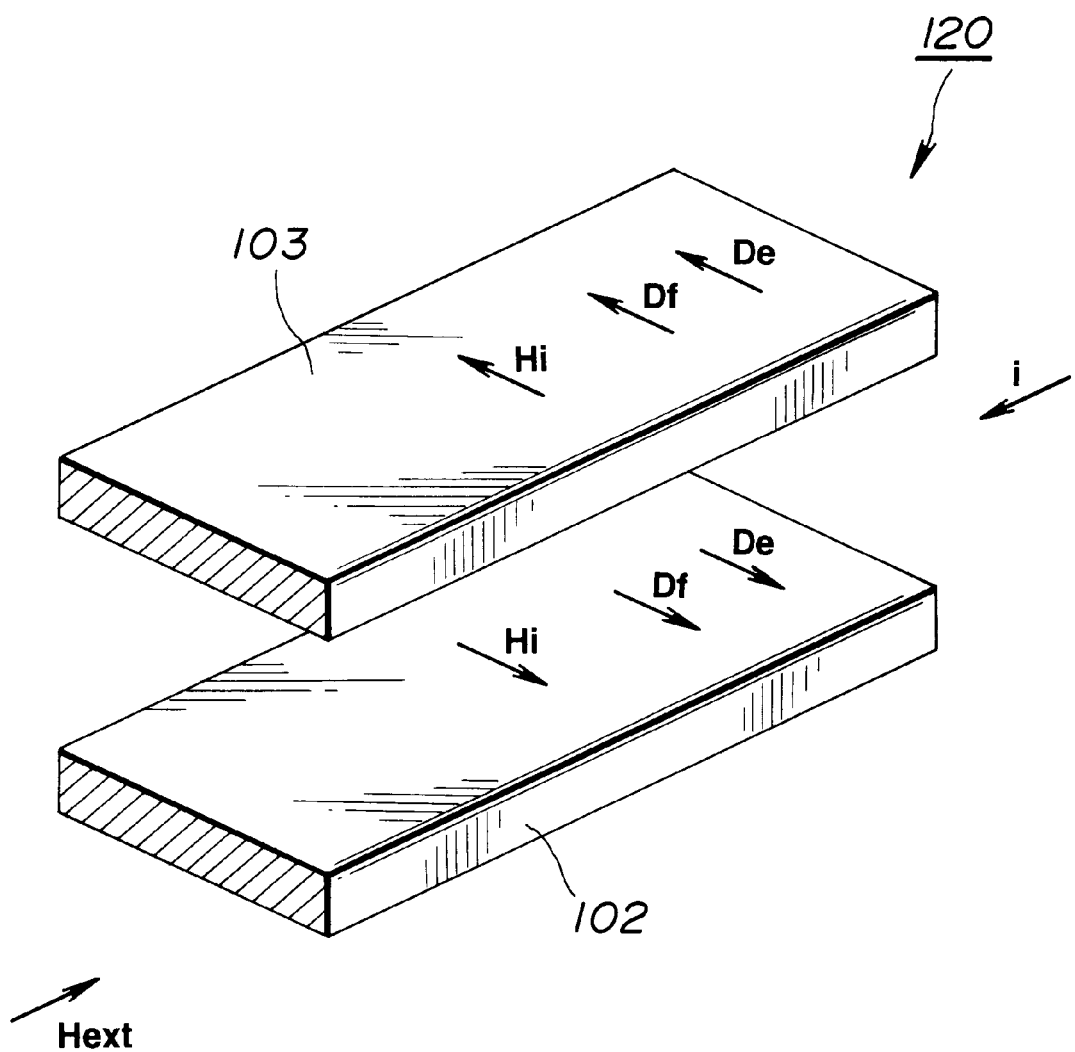
FIG. 4 is a perspective view showing essential parts of another conventional MR device.
Figure 5:
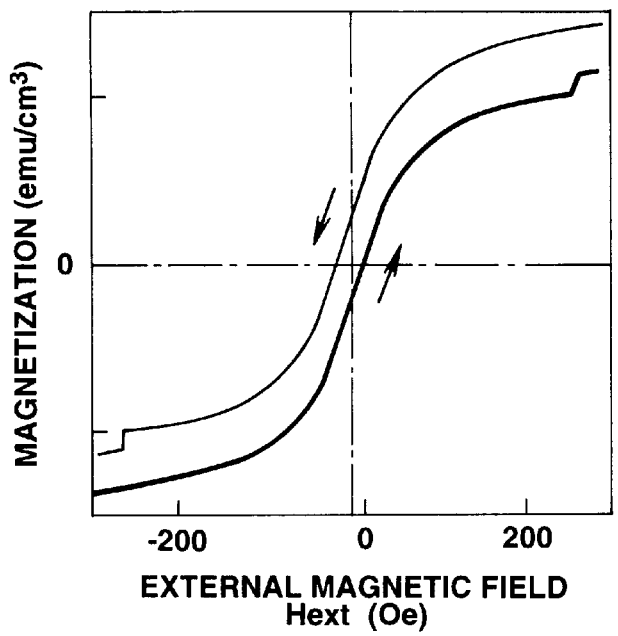
FIG. 5 is a graph showing a magnetization curve of the MR device shown in FIG. 4.
Figure 6:
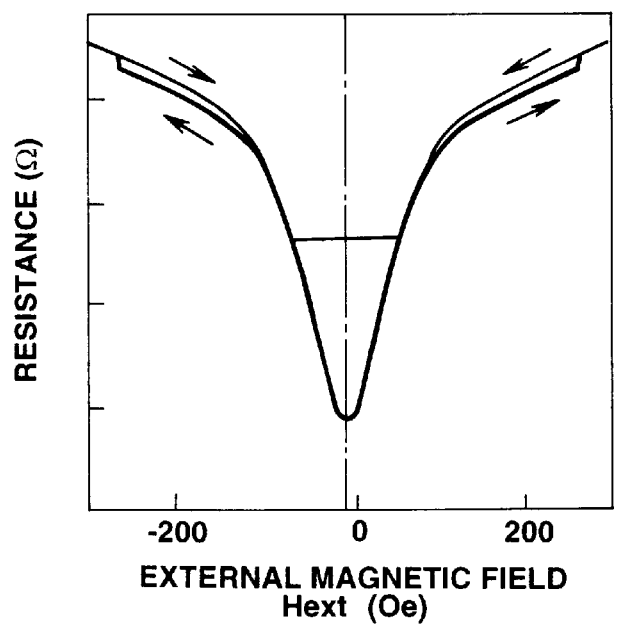
FIG. 6 is a graph showing a magneto-resistance curve of the MR device shown in FIG. 4.
Figure 7:
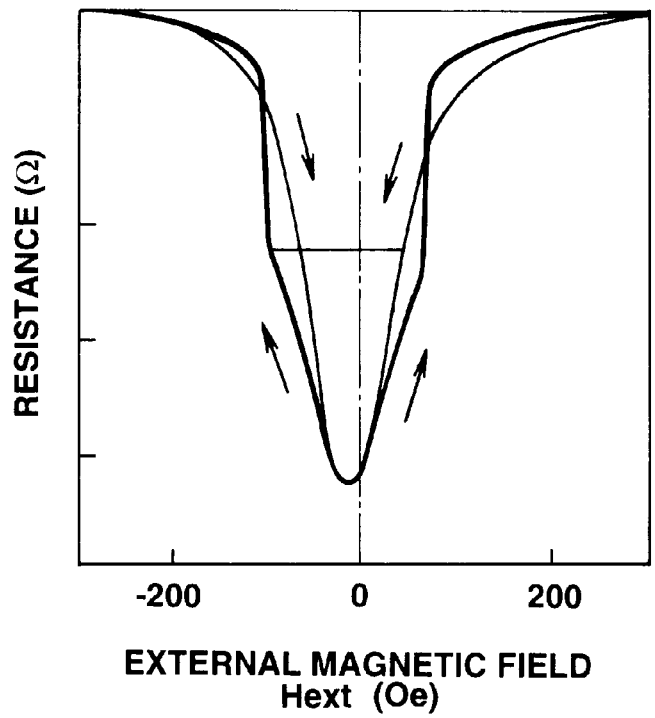
FIG. 7 is a graph showing a magneto-resistance curve obtained on reducing the width of the MR device shown in FIG. 4.
Figure 8:
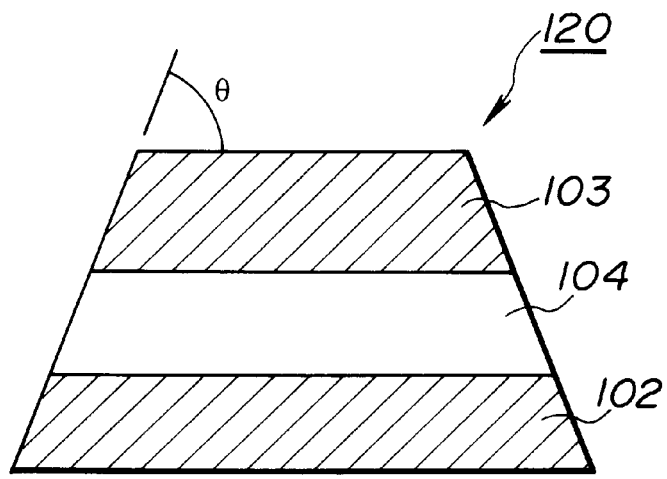
FIG. 8 is a cross-sectional view showing essential parts of the MR device shown in FIG. 4.
Figure 9:
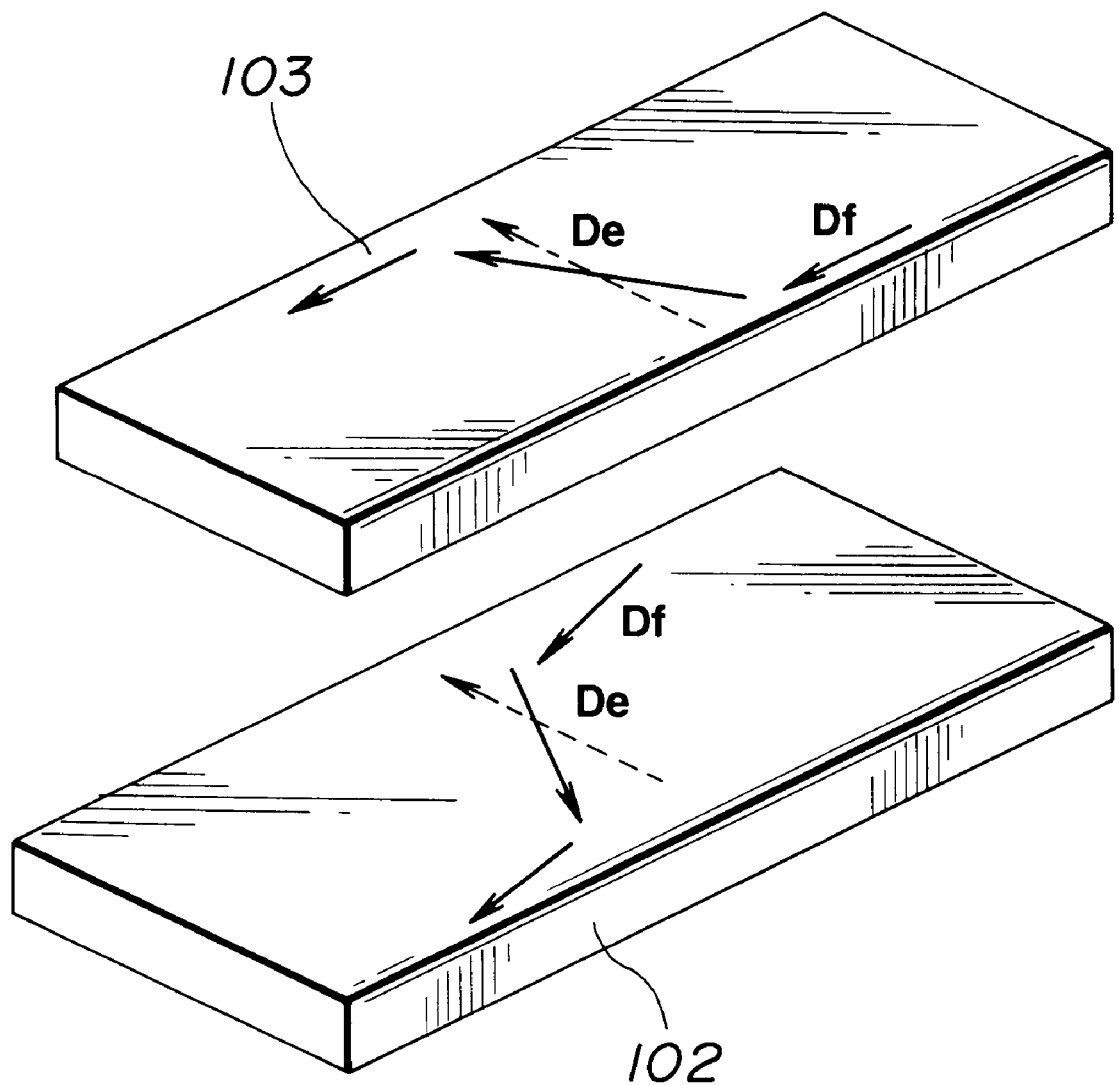
FIG. 9 is a perspective view showing schematically showing the direction of easy axis $D_e$ of each soft magnetic layer in the MR device of FIG. 4.

Referring to the drawings, preferred embodiments of an MR device and an MR head according to the present invention will be explained in detail.

First Embodiment

Figure 10:
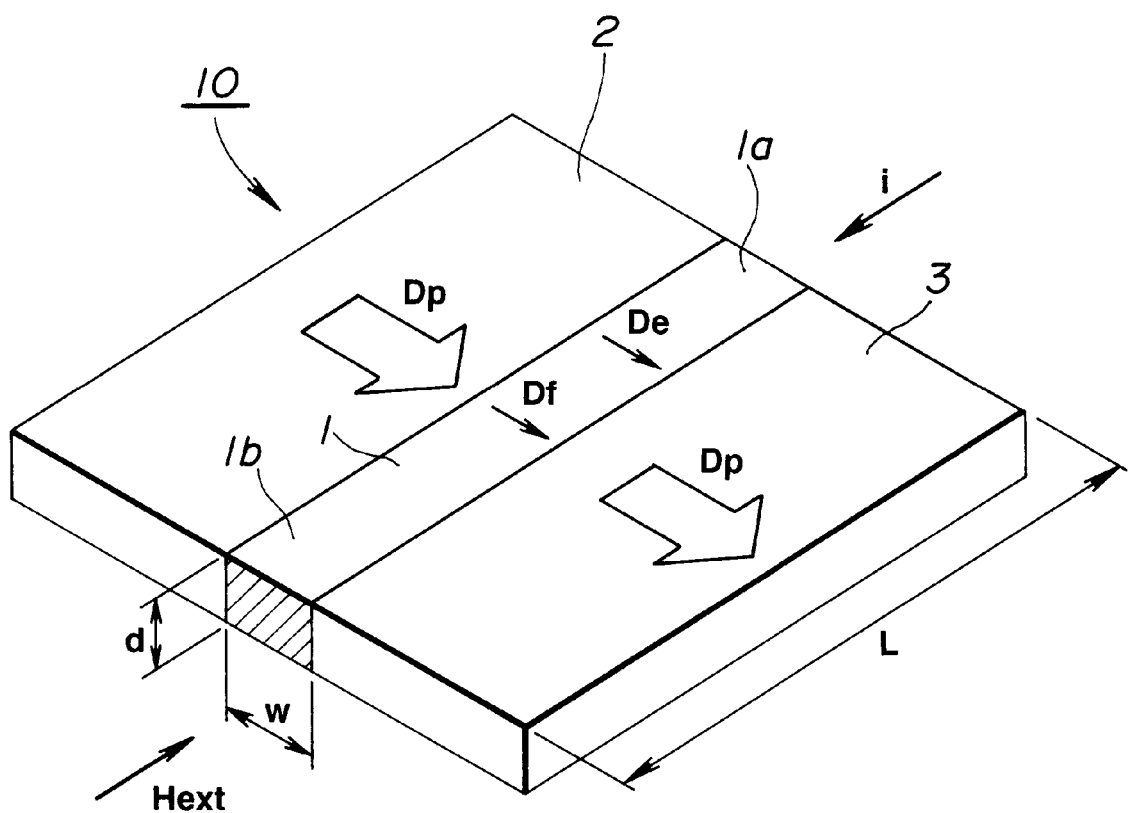
FIG. 10 is a perspective view showing essential parts of an embodiment of an MR device according to the present invention.
Figure 11:
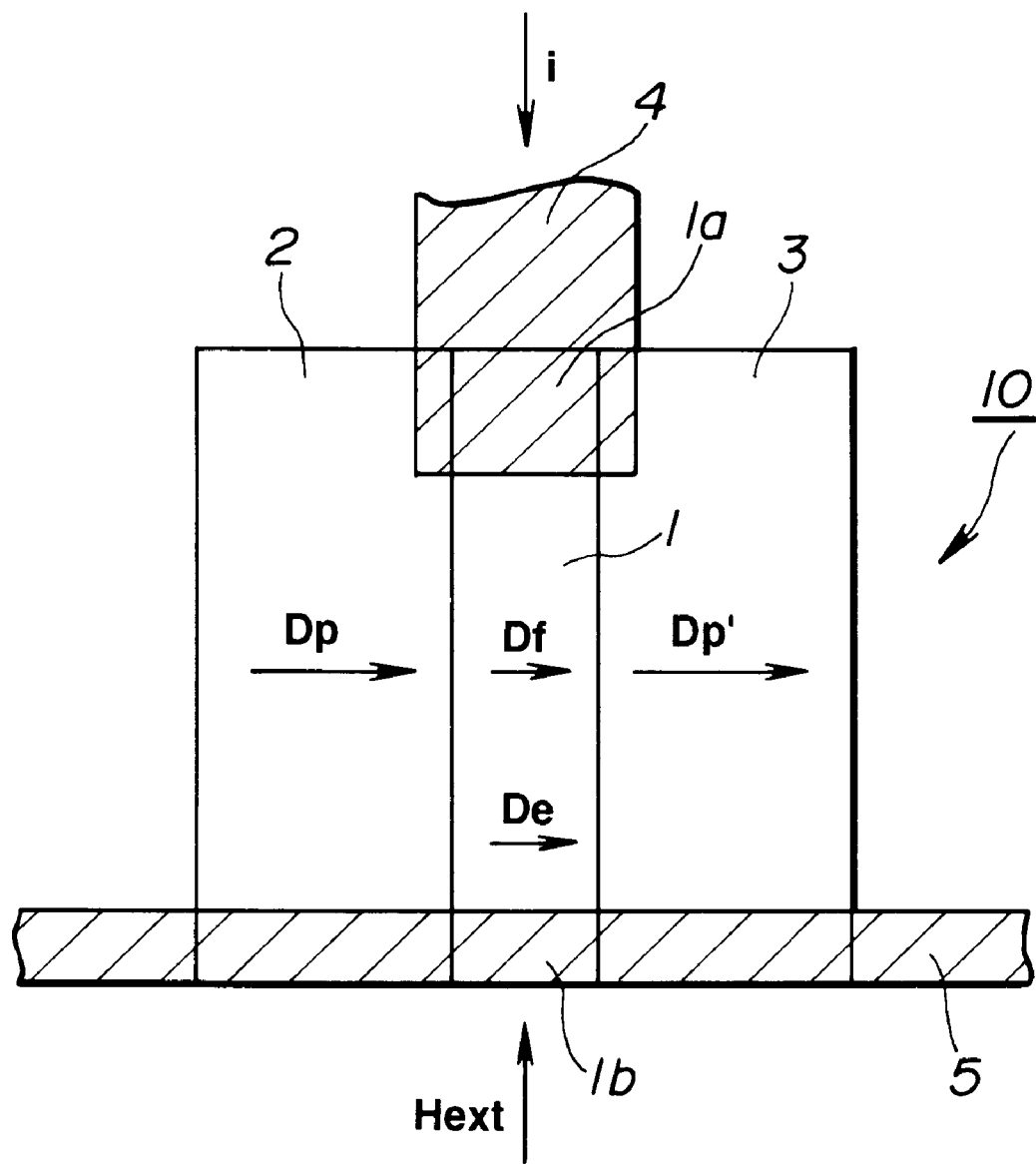
FIG. 11 is a schematic view showing the relative position between the soft magnetic layer and the magnetic domain stabilizer on one hand and the electrode on the other hand in the MR device of FIG. 9.

FIGS. 10 and 11 show an MR device 10 embodying the present invention. This MR device 10 has a mono-layer soft magnetic material 1 with a thickness d=15 nm, a width W=0.5 m and a length L=4 m, and a first magnetic domain stabilizer 2 and a second magnetic domain stabilizer 3, arranged on both sides along the width of the soft magnetic material 1. The MR device 10 also includes a rear end electrode 4 connected to a longitudinal end (rear end) of the soft magnetic material 1 and a forward end electrode 5 connected to the opposite longitudinal end (forward end) of the soft magnetic material 1.

It should be noted that the soft magnetic material 1 has its direction of magnetization $D_f$ rotated by the external magnetic field $H_{ext}$. Thus, with the above-mentioned MR device, the external magnetic field $H_{ext}$ is detected based on changes in resistance of the soft magnetic material 1. With this soft magnetic material 1, if the bias magnetic field from the first magnetic domain stabilizer 2 and the second magnetic domain stabilizer 3 is sufficiently large, it does not matter in which direction the direction of easy axis $D_e$ is set. The direction of easy axis $D_e$ is herein set so as to be parallel to the width of the soft magnetic material 1.

The first magnetic domain stabilizer 2 and the second magnetic domain stabilizer 3 are capable of generating a bias magnetic field having a component parallel to the width of the soft magnetic material 1. By this bias magnetic field, the first magnetic domain stabilizer 2 and the second magnetic domain stabilizer 3 can control the direction of magnetization $D_f$ of the soft magnetic material 1. The directions of magnetization Dp of the first magnetic domain stabilizer 2 and the second magnetic domain stabilizer 3 are set herein so as to be parallel to the direction of width of the soft magnetic material 1. The first magnetic domain stabilizer 2 and the second magnetic domain stabilizer 3 can be arranged in any position on the condition that they are arranged on both ends along the width of the soft magnetic material 1 so as to be symmetrical relative to a centerline parallel to the longitudinal direction of the soft magnetic material 1. The first magnetic domain stabilizer 2 and the second magnetic domain stabilizer 3 herein are arranged in the overall area extending from the rear end 1a as far as the forward end 1b of the soft magnetic material 1.

The rear end electrode 4 and the forward end electrode 5 are provided so as to be overlapped on the longitudinal ends 1a, 1b of the soft magnetic material 1 for allowing the sense current i to flow through the soft magnetic material 1 from the rear end electrode 4 towards the forward end electrode 5. The rear end electrode 4 is arranged along the length of the soft magnetic material 1 over a width wider than the width W of the soft magnetic material 1 so as to be overlapped not only with the rear end 1a of the soft magnetic material 1 but also partially with the neighboring magnetic domain stabilizers 2, 3. The forward end electrode 5 is of a width larger than the widths of the soft magnetic material 1 and the both side magnetic domain stabilizers 2, 3 summed together. Referring to FIG. 11, the forward end electrode 5 is contacted with the forward end 1b of the soft magnetic material 1 and the magnetic domain stabilizers 2, 3 so as to be extended from the upper portion of the drawing sheet towards the rear end electrode 4 along a warped path.

As the materials making up the above-mentioned soft magnetic material 1, any soft magnetic materials known in the art can be used. Examples of the soft magnetic materials include NiFe, NiFeCo, permalloys: NiFe—X (X=Ta, Cr, Nb, Rh, Zr, Mo, Al, Au, Pd, Pt, Si; a plurality of these elements may also be contained as X) and CoZr based amorphous alloys. For the rear end electrode 4 and the froward end electrode 5, electrically conductive non-magnetic metal materials may be used.

The magnetic domain stabilizers 2, 3 may each be a layer of a hard magnetic material, a layered film of a soft magnetic material and a hard magnetic material, an anti-ferromagnetic magnetic material or a layered film of a soft magnetic material and an anti-ferromagnetic magnetic material. The film of the hard magnetic material may be exemplified by CoPt, CoNiPt and CoCrTa films. The film of the anti-ferromagnetic material may be exemplified by FeMn, NiMn, NiO and NiCoO films. The film of the soft magnetic materials, that may be used in combination with the film of the hard magnetic material or with the film of the anti-ferromagnetic material, may be those similar to the above-mentioned soft magnetic materials.

Figure 12:
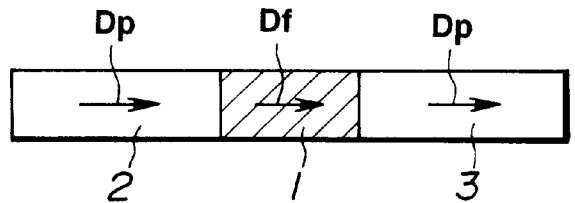
FIG. 12 is a cross-sectional view showing an embodiment of the magnetic domain stabilizer.

If the magnetic domain stabilizers 2, 3 are films of hard magnetic materials, these films of hard magnetic materials are ferromagnetically combined with the soft magnetic material 1 so that the direction of magnetization $D_f$ of the soft magnetic material 1 is aligned with the direction of magnetization $D_p$ of the film of the hard magnetic material, as shown in FIG. 12 showing the cross-section of the MR device 10 without showing the electrodes.

Figure 13:
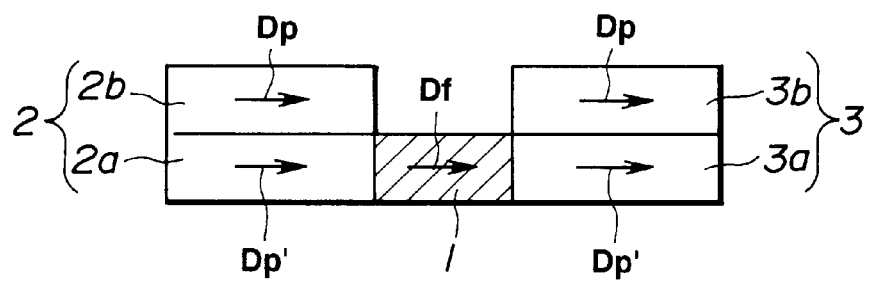
FIG. 13 is a cross-sectional view showing an embodiment of the magnetic domain stabilizer.
Figure 14:
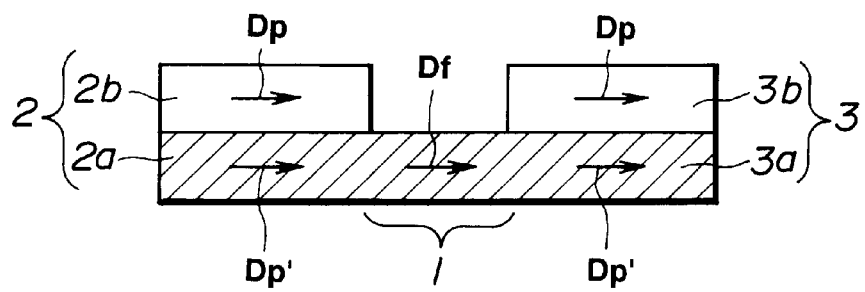
FIG. 14 is a cross-sectional view showing another embodiment of the magnetic domain stabilizer.

If the magnetic domain stabilizers 2, 3 are layered films of the soft magnetic material and the hard magnetic material, layers 2a, 3a of the soft magnetic materials in the magnetic domain stabilizers 2, 3 and the soft magnetic material 1 may be formed of different materials, as shown in FIG. 13. Alternatively, the layers 2a, 3a of the soft magnetic materials in the magnetic domain stabilizers 2, 3 and the soft magnetic material 1 may be formed unitarily from a common material, as shown in FIG. 14. At any rate, if the soft magnetic materials 2a, 3a overlapped with the films of the hard magnetic material are ferromagnetically combined with the films of the hard magnetic materials 2b, 3b in the direction of magnetization $D_pAE$ so that the direction of magnetization DpAE of the soft magnetic materials 2a, 3a is aligned with the direction of magnetization $D_p$ of the films of the hard magnetic materials 2b, 3b, the direction of magnetization $D_f$ of the film of the soft magnetic material not overlapped with the hard magnetic materials 2b, 3b, that is the layer of the soft magnetic material 1, is also aligned with the direction of magnetization DpAE of the soft magnetic materials 2a, 3a arranged on its both ends.

The above observations for the magnetic domain stabilizers 2, 3 formed by films of the hard magnetic materials or the layered films of the soft magnetic materiels and the hard magnetic materials hold for the magnetic domain stabilizers 2, 3 formed by films of the anti-ferromagnetic film or the layered films of the soft magnetic materiels and the anti-ferromagnetic materials.

Figure 15:
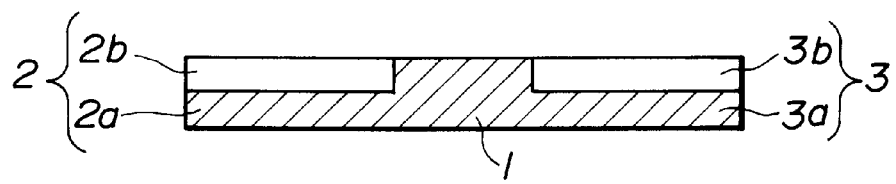
FIG. 15 is a cross-sectional view showing still another embodiment of the magnetic domain stabilizer.

In FIGS. 13 and 14, the films of the soft magnetic materials 2a, 3a in the magnetic domain stabilizers 2, 3 are formed to the same thickness as that of the soft magnetic material 1, if the magnetic domain stabilizers 2, 3 are formed as layered films. However, this is merely illustrative. Thus the layered films of the magnetic domain stabilizers 2, 3 in their entirety may be formed to the same thickness as that of the soft magnetic material 1, as shown in FIG. 15.

In the MR device 10 of the present embodiment, the electrical resistance $R_p$ of the magnetic domain stabilizers 2, 3 is selected to be larger than the electrical resistance $R_f$ of the soft magnetic material 1. Since the length of the magnetic domain stabilizers 2, 3 in the flowing direction of the sense current i in the magnetic domain stabilizers 2, 3 is equal to that of the soft magnetic material 1, it suffices if the value of (resistivity $\rho_p$ of the material making up the magnetic domain stabilizers 2, 3)/(cross-sectional area $S_p$ of the magnetic domain stabilizers 2, 3 in a cross-section perpendicular to the flowing direction of the sense current i) is set so as to be larger than the value of (the resistivity $\rho_f$ of the material of the soft magnetic material)/(cross-section area $S_f$ of the soft magnetic material 1 in the above-mentioned cross-sectional area).

If the cross-sectional area $S_p$ is reduced for increasing the electrical resistance $R_p$ of the magnetic domain stabilizers 2, 3, it suffices to reduce the width or the thickness of the magnetic domain stabilizers 2, 3. On the other hand, if the resistivity $\rho_p$ is increased for increasing the electrical resistance $R_p$ of the magnetic domain stabilizers 2, 3, it is sufficient to select a material inherently having the high resistivity $\rho_p$. It is however also possible to selectively introduce impurities to the magnetic domain stabilizers 2, 3 or to selectively oxidize the magnetic domain stabilizers 2, 3.

In the above-described MR device 10 of the instant embodiment, the direction of magnetization $D_f$ of the soft magnetic material 1 is oriented in the direction of width to overcome the static magnetic anisotropy in the longitudinal direction by the bias magnetic field of the magnetic domain stabilizers 2, 3, despite the fact that the width W of the soft magnetic material 1 is as small as 0.5 m. Therefore, if the external magnetic field $H_{ext}$ is supplied from the forward side 1b of the soft magnetic material 1 at the same time as the sense current i is caused to flow between the electrodes 4, 5, the soft magnetic material 1 is changed in resistance, such that the external magnetic field $H_{ext}$ can be detected as changes of voltage across the electrodes 4, 5.

Figure 16:
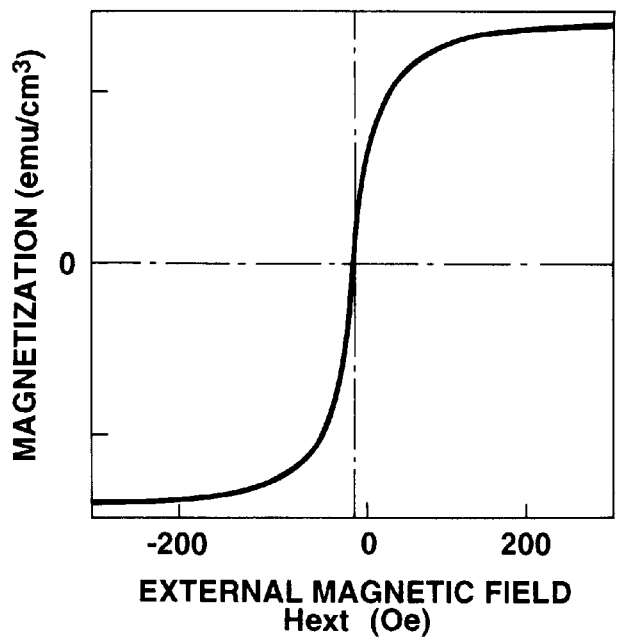
FIG. 16 is a graph showing a magnetization curve of an MR device according to the present invention.
Figure 17:
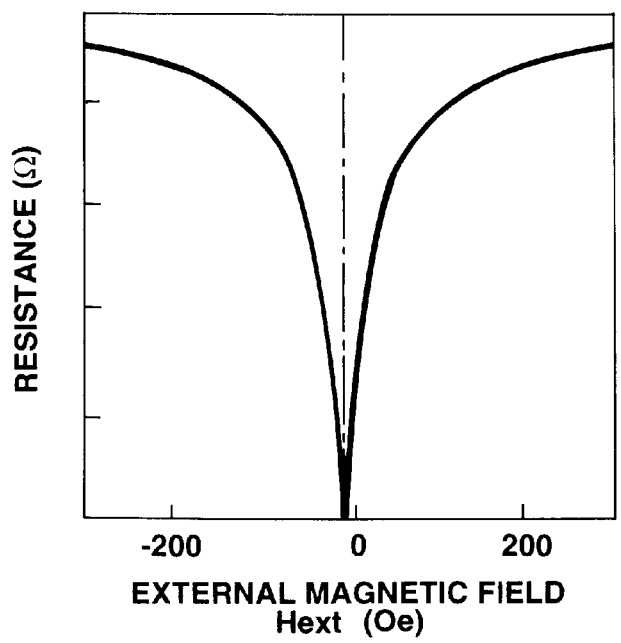
FIG. 17 is a graph showing a magneto-resistance curve of the MR device according to the present invention.

By measuring the magnetization on application of the external magnetic field $H_{ext}$ from the direction parallel to the longitudinal direction of the MR device 10, a smooth magnetization curve free of hysteresis is obtained, as shown in FIG. 16. By measuring the electrical resistance, a smooth magnetic reluctance curve free of hysteresis is obtained, as shown in FIG. 17. The reason is that, in the absence of the impressed external magnetic field $H_{ext}$, the direction of magnetization $D_f$ of the soft magnetic material 1 is oriented in the direction of the easy axis $D_e$ due to the bias magnetic field of the magnetic domain stabilizers 2, 3.

In the MR device 10 of the present embodiment, the electrical resistance $R_p$ of the magnetic domain stabilizers 2, 3 is selected for increasing the electrical resistance $R_f$ of the soft magnetic material 1 for suppressing the current loss.

Second Embodiment

In the present embodiment, an insulating material is interposed between the soft magnetic material 1 and the magnetic domain stabilizers 2, 3 for suppressing the current loss to the soft magnetic material 1.

Figure 18:
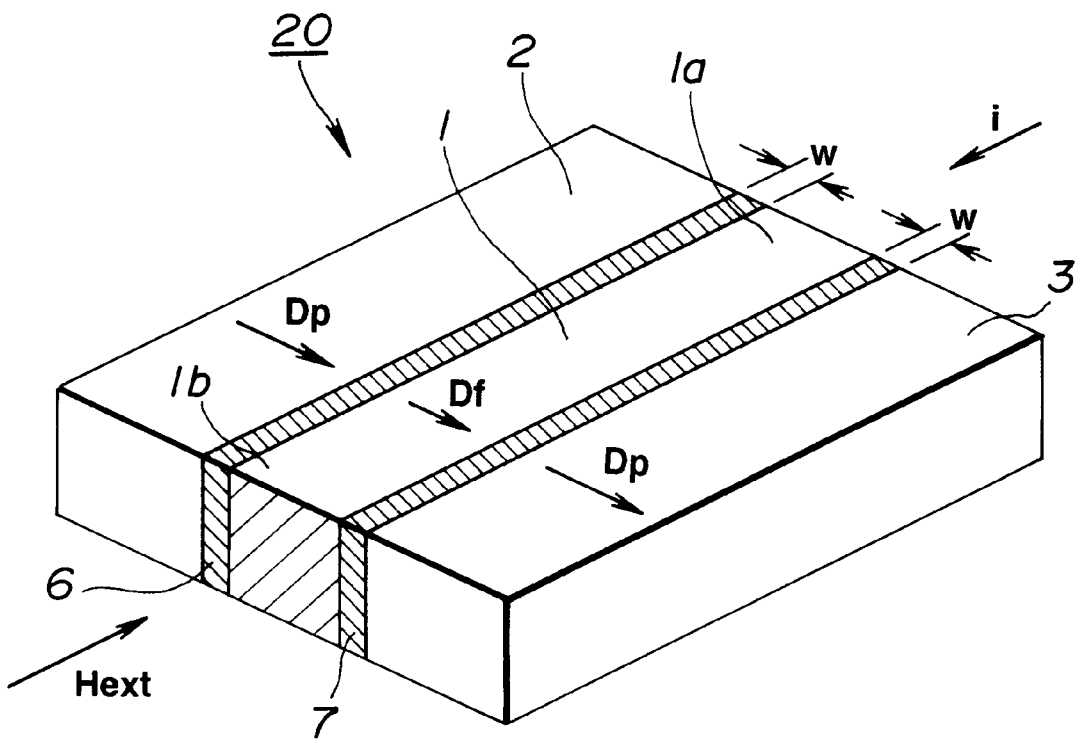
FIG. 18 is a perspective view showing essential parts of a modification of an MR device according to the present invention.
Figure 19:
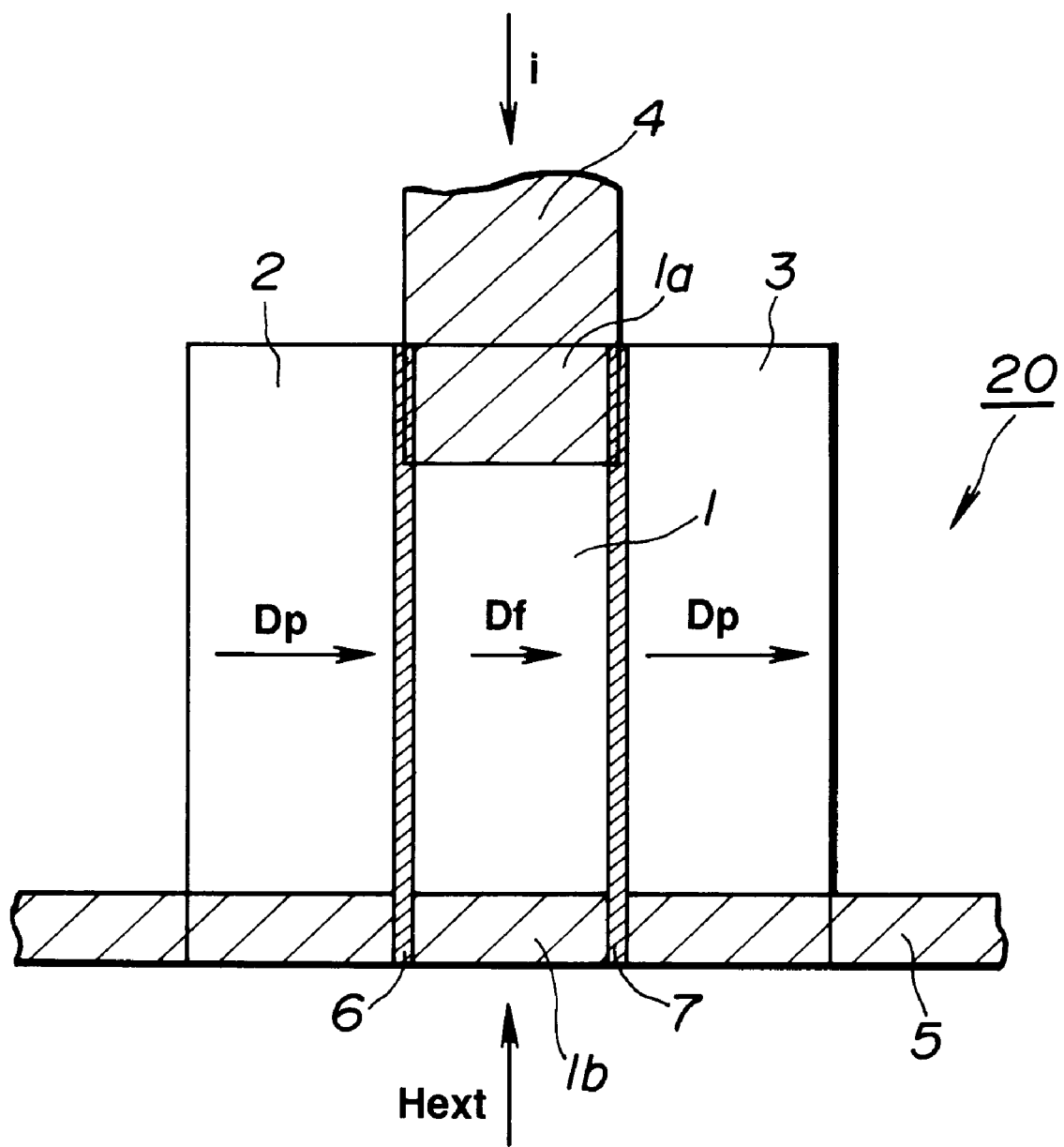
FIG. 19 is a schematic view, as seen from above, showing the relative position between the soft magnetic layer and the magnetic domain stabilizer on one hand and the electrode on the other hand in the MR device of FIG. 18.

FIGS. 18 and 19 illustrate an MR device 20 of the present embodiment. In the MR device 20, similarly to the MR device of the first embodiment, magnetic domain stabilizers 2, 3 are arranged on both ends along the width of the mono-layer soft magnetic material 1, while electrodes 4, 5 are provided for being overlapped with both longitudinal ends 1a, 1b of the soft magnetic material 1. However, the MR device 20 of the present embodiment differs from the first embodiment in that a first insulating material 6 and a second insulating material 7 are interposed between the soft magnetic material 1 and the magnetic domain stabilizers 2, 3.

The soft magnetic material 1 may be configured similarly to that of the first embodiment. The magnetic domain stabilizers 2, 3, similarly to those of the first embodiment, generate a bias magnetic field having components parallel to the direction of width of the soft magnetic material 1 for controlling the direction of magnetization $D_f$ of the soft magnetic material. The magnetic domain stabilizers 2, 3 again are arranged for the entire extent of the soft magnetic material 1 extending from the rear end 1a to the forward end 1b of the soft magnetic material 1. In addition, the direction of magnetization $D_p$ of the magnetic domain stabilizers 2, 3 is oriented so as to be parallel to the direction of width of the soft magnetic material 1. However, in the present embodiment, the magnetic domain stabilizers 2, 3 are necessarily mono-layer films composed of a hard magnetic material.

It suffices if the electrodes 4, 5 are formed of the same material as that of the first embodiment. However, at least one of the electrodes 4, 5 needs to be out of contact with the magnetic domain stabilizers 2, 3. The rear end electrode 4 is formed to a width narrower than the combined width of the soft magnetic material 1 and the insulating materials 6, 7 on its both sides so as not to be overlapped with the magnetic domain stabilizers 2, 3. The forward end electrode 5 is contacted with the magnetic domain stabilizers 2, 3, as in the first embodiment.

The insulating materials 6, 7 may be formed of any materials if only they can electrically insulate the soft magnetic material 1 and the magnetic domain stabilizers 2, 3 from each other. Meanwhile, the magnitude of the bias magnetic field induced by the magnetic domain stabilizers 2, 3 is inversely proportionate to the third power of the distance such that the larger the width w of the insulating materials 6, 7, the more difficult it becomes to stabilize the magnetic domain of the soft magnetic material 1. Therefore, the width w of the insulating materials 6, 7 is desirably of the smallest value possible if only the insulating properties are maintained.

In the above-described MR device 20, since the soft magnetic material 1 and the magnetic domain stabilizers 2, 3 are electrically insulated from each other, there is no risk of the sense current flowing in the magnetic domain stabilizers 2, 3, thereby suppressing current loss.

Also, in the present MR device 30, since the direction of magnetization $D_f$ of the soft magnetic material 1 is controlled by the bias magnetic field of the magnetic domain stabilizers 2, 3, stable magneto-resistance effect may be achieved.

Figure 20:
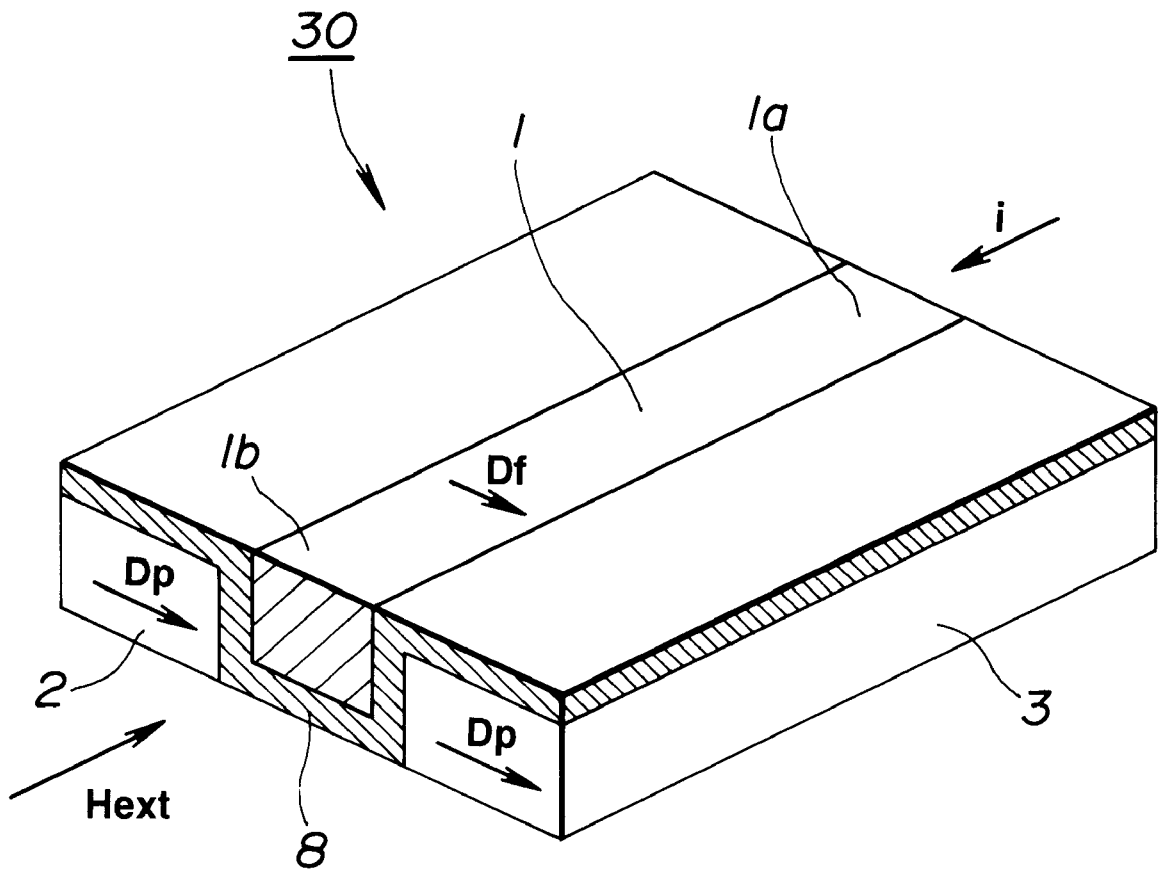
FIG. 20 is a perspective view showing essential parts of another embodiment of an MR device according to the present invention.
Figure 21:
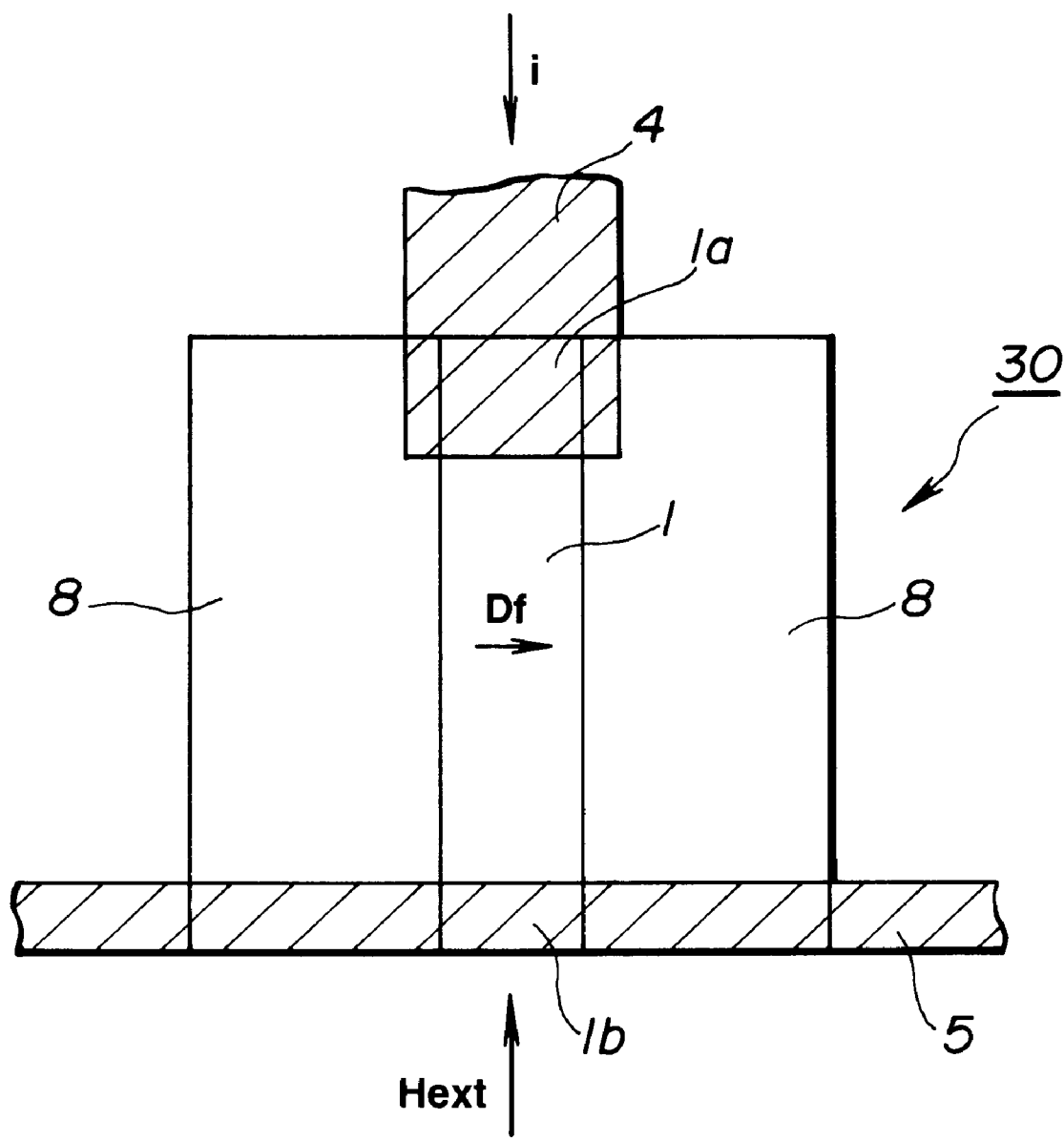
FIG. 21 is a schematic view, as seen from above, showing the relative position between the soft magnetic layer and the magnetic domain stabilizer on one hand and the electrode on the other hand in the MR device of FIG. 20.

FIGS. 20 and 21 show an MR device 30 modified from the above-described MR device 30. With the MR device 20, shown in FIGS. 18 and 19, the insulating materials 6, 7 are provided only on both sides along the width of the soft magnetic material 1, as described previously. With the MR device 30, shown in FIGS. 20 and 21, an insulating material 8 is provided for extending from the lower side of the soft magnetic material 1 to both lateral sides of the along the width of the soft magnetic material 1 and to the upper sides of the magnetic domain stabilizers 2, 3. With such MR device 30, the production process can be simplified as compared to that for the MR device 20.

Also, in the present MR device 30, since the upper surfaces of the magnetic domain stabilizers 2, 3 are covered with the insulating material 8, there is no risk of the electrodes 4, 5 being contacted with the magnetic domain stabilizers 2, 3, even if the width of the rear end electroW 4 is larger than the width W of the soft magnetic material 1. Thus the MR device 30 has a merit that the wider margin for patterning the electrode 4 may be allowed in the production process thereof.

Third Embodiment

In the present fourth embodiment, the current loss to the soft magnetic material 1 can be disregarded.

Figure 22:
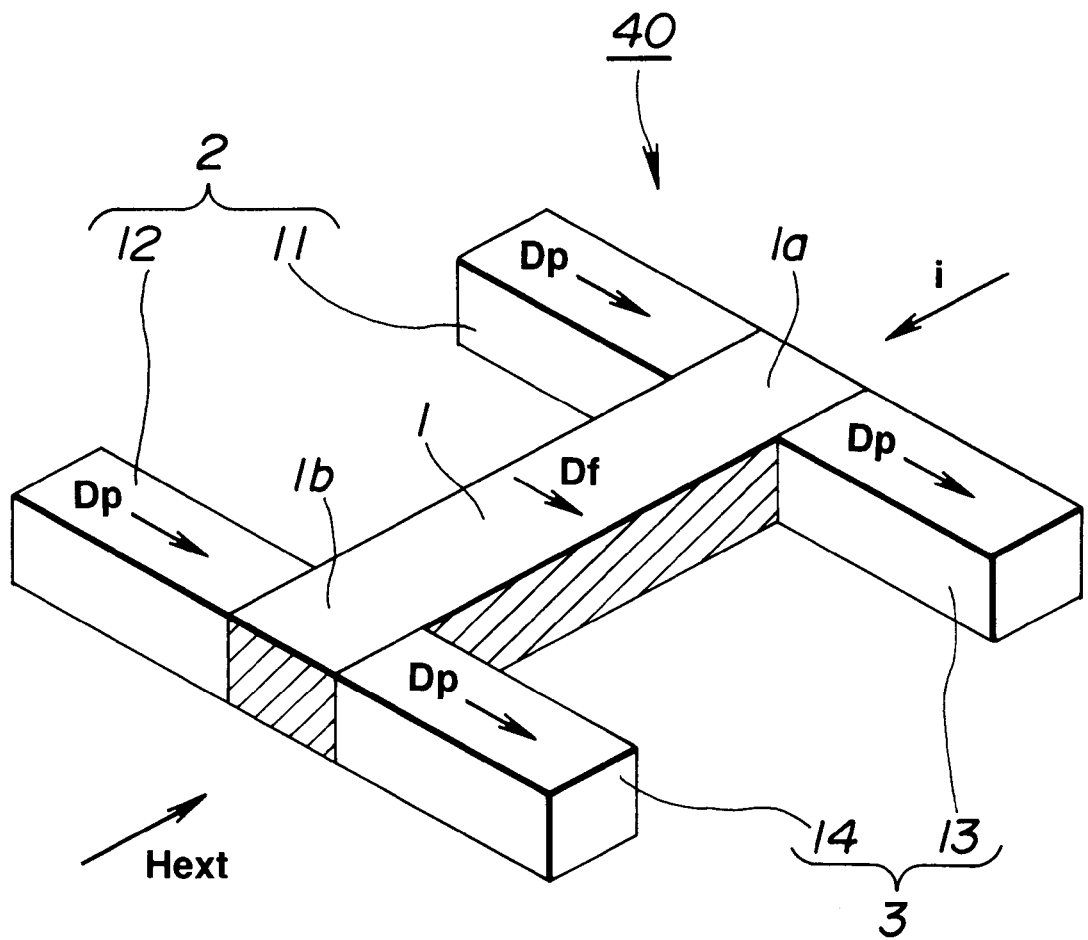
FIG. 22 is a perspective view showing essential parts of a modification of the MR device according to the present invention.
Figure 23:
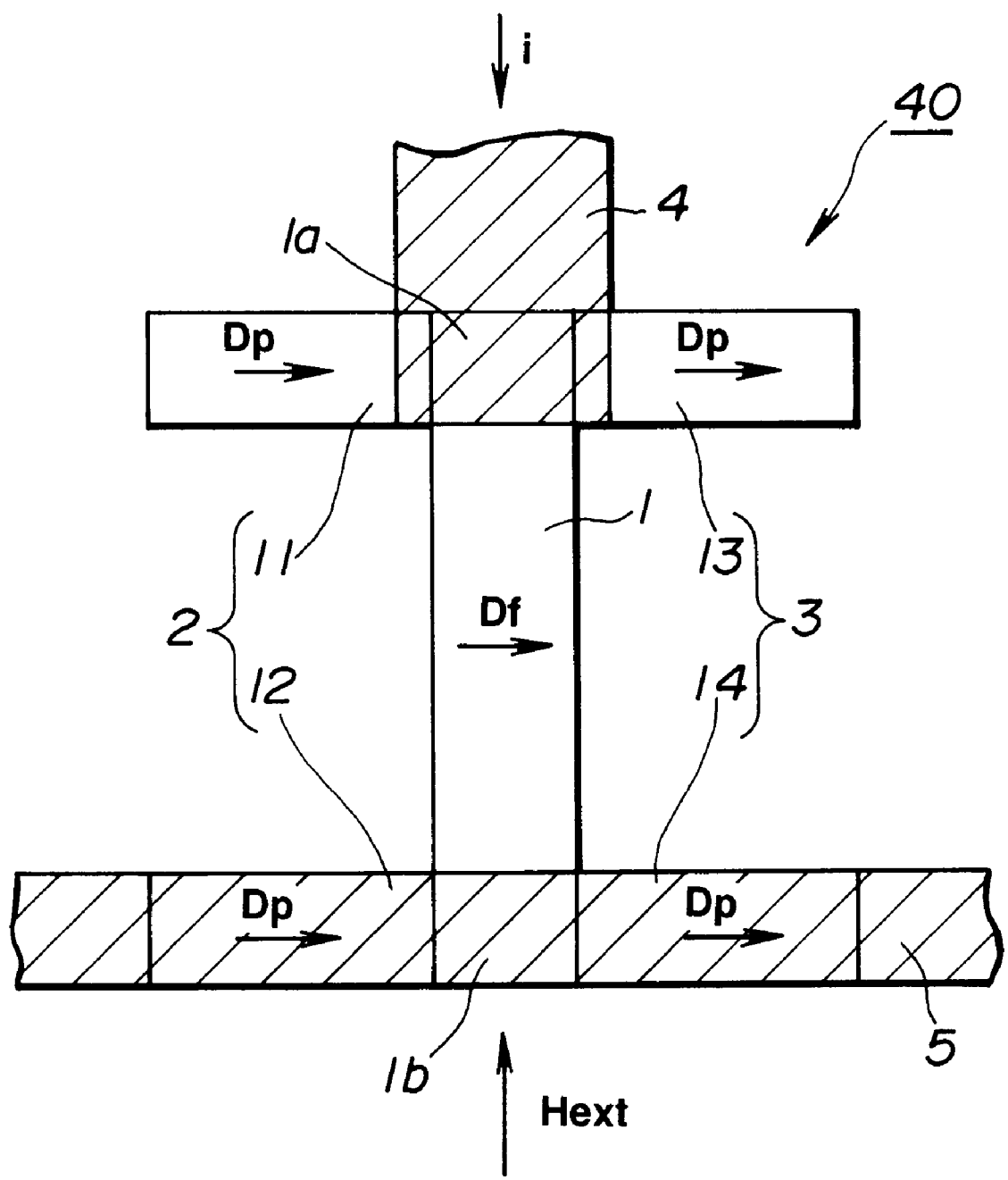
FIG. 23 is a schematic view, as seen from above, showing the relative position between the soft magnetic layer and the magnetic domain stabilizer on one hand and the electrode on the other hand in the MR device of FIG. 22.

FIGS. 22 and 23 illustrate an MR device 40 of the present embodiment. With the present MR device 40, similarly to the first embodiment, magnetic domain stabilizers 2, 3 are provided on both ends along the width of the mono-layer soft magnetic material 1, while electrodes 4, 5 are provided at both longitudinal ends 1a, 1b of the mono-layer soft magnetic material 1. However, the MR device 40 of the present embodiment differs from the first embodiment in that the magnetic domain stabilizers 2, 3 are provided only in the vicinity of both longitudinal ends 1a, 1b of the soft magnetic material 1.

That is, the first magnetic domain stabilizer 2 is made up of a rear magnetic domain stabilizer 11 provided in an area of the lateral side of the soft magnetic material 1 corresponding to the contact area between the soft magnetic material 1 and the rear end electrode 4 and a magnetic domain stabilizer 12 provided in an area of the lateral side of the soft magnetic material 1 corresponding to the contact area between the soft magnetic material 1 and the forward end electrode 4. The second magnetic domain stabilizer 3 is made up of a rear magnetic domain stabilizer 13 provided in an area of the lateral side of the soft magnetic material 1 corresponding to the contact area between the soft magnetic material 1 and the rear end electrode 4 and a magnetic domain stabilizer 14 provided in an area of the lateral side of the soft magnetic material 1 corresponding to the contact area between the soft magnetic material 1 and the forward end electrode 4. Consequently, the magnetic domain stabilizers 2, 3 are not contacted with an area of the soft magnetic material 1 between the electrodes 4 and 5 operating effectively as a magnetically sensitive portion. The magnetic domain stabilizers 2, 3 may be provided only on the rear end 1a or on the forward end 1b of the soft magnetic material 1. In the present embodiment, however, the magnetic domain stabilizers 2, 3 are provided in the vicinity of the ends 1a, 1b of the soft magnetic material 1 for applying a sufficient bias magnetic field to the soft magnetic material 1.

The materials making up the soft magnetic material 1, magnetic domain stabilizers 2, 3 and the electrodes 4, 5 may be the same as those shown in the first embodiment.

In the above-described MR device 40 of the instant embodiment, since the magnetic domain stabilizers 2, 3 are not contacted with the magnetically sensitive portion of the soft magnetic material 1, there is no loss caused in the sense current i supplied to the magnetically sensitive portion without the necessity of increasing the electrical resistance $R_p$ of the magnetic domain stabilizers 2, 3 or interposing an insulating material between the soft magnetic material 1 and the magnetic domain stabilizers 2, 3. Moreover, with the MR device 40 of the instant embodiment, stable magneto-resistance characteristics may be realized since the direction of magnetization $D_f$ of the soft magnetic material 1 is controlled by the bias magnetic field of the magnetic domain stabilizers 2, 3.

Fourth Embodiment

Figure 24:
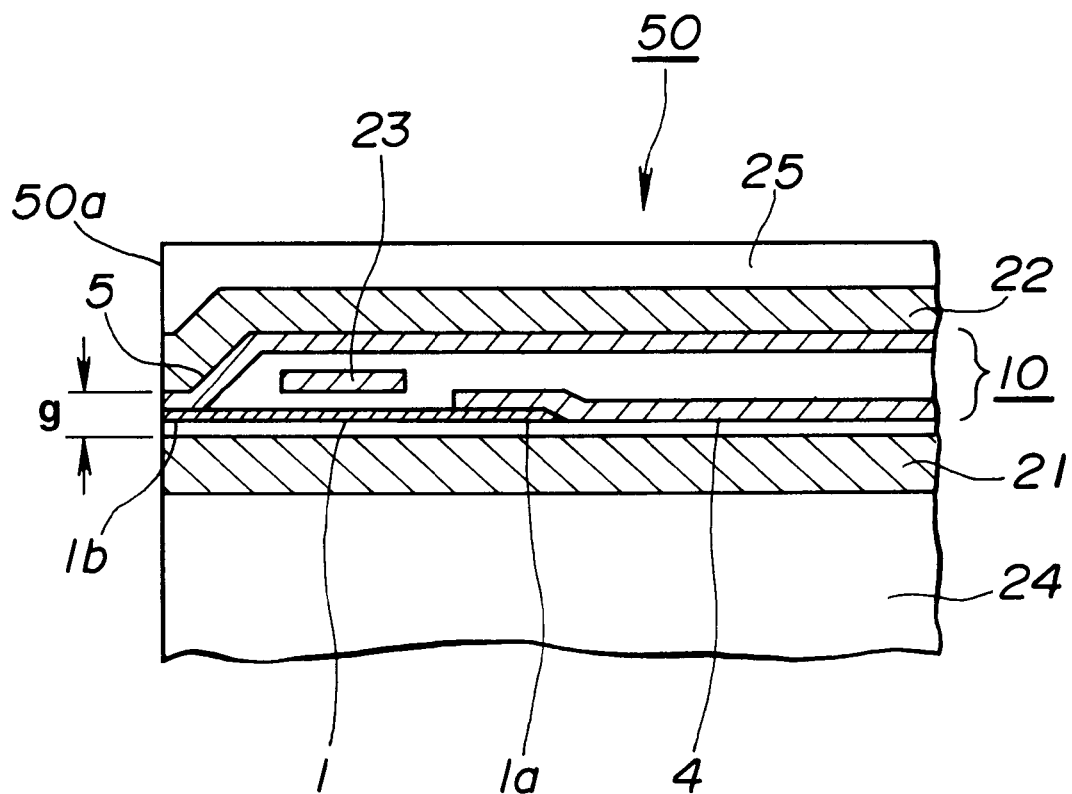
FIG. 24 is a cross-sectional view showing an embodiment of an MR head employing an MR device according to the present invention.

Referring to FIG. 24, an embodiment in which the MR device 10 of the first embodiment is applied to a vertical type MR head is explained.

The vertical type magnetic head 50 is made up of an MR device 10, shown in FIGS. 10 and 11, sandwiched between a lower magnetic shield 21 and an upper magnetic shield 22. The upper magnetic shield 22 is bent in the vicinity of a facing surface thereof to the magnetic recording medium in a direction of reducing the distance between the lower magnetic shield 21 and the upper magnetic shield 22. The spacing between the foremost parts of the lower magnetic shield 21 and the upper magnetic shield 22 represents a magnetic gap g.

In the vertical type magnetic head 50, the MR device 10 is arranged so that the longitudinal direction of the soft magnetic material 1 is perpendicular to the signal recording surface of the magnetic recording medium and so that the forward end 1b of the soft magnetic material 1 represents the facing side to the magnetic recording medium. Also, in the vertical type magnetic head 50, a bias conductor 23 is arranged on top of the magnetically sensitive portion of the soft magnetic material 1 at right angles with the soft magnetic material 1. The role of the bias conductor 23 is to apply the bias magnetic field to the soft magnetic material 1 for improving linearity of detection signals.

The above-described vertical type MR head is arranged on a slider formed of a non-magnetic material, such as $Al_2O_3$—TiC. On the upper magnetic shield 22 is applied a protective film 25.

In the vertical type magnetic head 50, the signal magnetic field from the magnetic (external magnetic field $H_{ext}$) can be detected by exploiting the fact that the MR device 10 undergoes resistance changes by the external magnetic field $H_{ext}$.

In the present magnetic head 50, the portion of the soft magnetic material 1 affected by the signal magnetic field (external magnetic field $H_{ext}$) is a length thereof extending rearwards from the forward end facing the facing surface 50a to the magnetic recording medium a distance corresponding to the magnetic gap g. With the MR device 10, used here, the magnetic domain stabilizers 2, 3 are arranged in the entire longitudinal area of the soft magnetic material 1. In the area of the soft magnetic material 1 affected by the signal magnetic field (external magnetic field $H_{ext}$), the direction of magnetization $D_f$ of the soft magnetic material 1 is controlled sufficiently. Therefore, with the magnetic head 50 employing the MR device 10, optimum reproduction becomes possible without generation of the Barkhausen noise.

The signal magnetic field can be reproduced satisfactorily by using the MR devices 20, 30 or 40 of the second and third embodiments, in place of the MR device 10 of the first embodiment, in constructing the magnetic head.

What is claimed is:

1. A magneto-resistance effect device comprising:

an MR element which exhibits a magneto-resistance effect, said MR element comprising a soft magnetic material, said MR element having a longitudinal dimension which is greater than its lateral dimension;

a first electrode overlying and connected to one longitudinal end of said MR element, said first electrode positioned within the longitudinal dimension of said MR element, said one longitudinal end being an air bearing surface of said MR element;

a second electrode connected to the other longitudinal end of said MR element; and magnetic domain stabilizers positioned and arranged such that one magnetic domain stabilizer is positioned on each lateral side of said MR element, said stabilizers generating bias magnetic fields in a field direction parallel to said lateral dimension of said MR element, in order to orient the magnetization of the MR element along said field direction, said stabilizers having a dimension parallel to the longitudinal dimension of the MR element which is less than or equal to said longitudinal dimension of said MR element, said stabilizers being symmetrically positioned on said opposite lateral sides of said MR element whereby sense current is adapted to flow through said MR element via said first and second electrodes in a direction substantially parallel to a detectable external magnetic signal field and substantially perpendicular to said bias magnetic fields and magnetization of said stabilizers and said MR element, respectively.

2. The magneto-resistance effect device as claimed in claim 1, wherein said magnetic domain stabilizers extend continuously from said one longitudinal end of the MR element to the other longitudinal end of the MR element.

3. The magneto-resistance effect device as claimed in claim 1, wherein said magnetic domain stabilizers are constructed and arranged to have distinctly separate portions positioned at both said one longitudinal end and the other longitudinal end of the MR element.

4. The magneto-resistance effect device as claimed in claim 3, wherein each of said magnetic domain stabilizers comprises two stabilizer means such that said distinctly separate portions of said magnetic domain stabilizers are not connected to one another.

5. The magneto-resistance effect device as claimed in claim 1, wherein the electrical resistance of each of the magnetic domain stabilizers is greater than that of the MR element.

6. The magneto-resistance effect device as claimed in claim 1, wherein an insulating layer is positioned between each of said magnetic domain stabilizers and the MR element.

7. The magneto-resistance effect device as claimed in claim 6, wherein at least one of the first electrode and the second electrode is not in contact with the magnetic domain stabilizers.

8. The magneto-resistance effect device as claimed in claim 1, wherein an insulating layer is positioned under a lower surface of the MR element, between the magnetic domain stabilizers and the lateral surfaces of the MR element, and on an upper surface of each of the magnetic domain stabilizers.

9. The magneto-resistance effect device as claimed in claim 1, wherein each of said magnetic domain stabilizers comprises a hard magnetic material film.

10. The magneto-resistance effect device as claimed in claim 1, wherein each of said magnetic domain stabilizers comprises layers of soft magnetic and hard magnetic material films.

11. The magneto-resistance effect device as claimed in claim 1, wherein each of said magnetic domain stabilizers comprises an anti-ferro magnetic material film.

12. The magneto-resistance effect device as claimed in claim 1, wherein each of said magnetic domain stabilizers comprises layers of soft magnetic and anti-ferro magnetic material films.

13. A magnetic head comprising:

a magneto-resistance effect device, itself comprising (1) an MR element which exhibits a magneto-resistance effect, said MR element comprising a soft magnetic material, said MR element having a longitudinal dimension which is greater than its lateral dimension, (2) a first electrode overlying and connected to one longitudinal end of said MR element, said first electrode positioned within the longitudinal dimension of said MR element, said one longitudinal end of said MR element being an air bearing surface of said MR element, (3) a second electrode connected to the other longitudinal end of said MR element, and (4) magnetic domain stabilizers positioned in the range so that one magnetic domain stabilizer is positioned on each side of said MR element, said stabilizers generating bias magnetic fields in a field direction parallel to said lateral dimension of said MR element, in order to orient the magnetization of the MR element along said field direction, said stabilizers having a dimension parallel to the longitudinal dimension of the MR element which is less than or equal to said longitudinal dimension of said MR element, said stabilizers being symmetrically positioned on said opposite sides of said MR element; and a bias conductor positioned in the range to overlie said MR element for applying a bias magnetic field to said MR element, said bias conductor having a longitudinal direction which is perpendicular to the longitudinal direction of the MR element whereby sense current is adapted to flow through said MR element via said first and second electrodes in a direction substantially parallel to a detectable external magnetic signal field and substantially perpendicular to said bias magnetic fields and magnetization of said stabilizers and said MR element, respectively; and upper and lower magnetic shields arranged above and below, respectively, said magneto-resistance effect device, said upper magnetic shield above said first electrode so as to be bent in the vicinity of a surface facing a magnetic recording medium so that the distance between the upper and lower magnetic shields is reduced in that vicinity.

14. The magnetic head as claimed in claim 13, wherein said magnetic domain stabilizers are constructed and arranged so as to extend continuously between said longitudinal ends of said MR element.

15. The magnetic head as claimed in claim 13, wherein said magnetic domain stabilizers are constructed and arranged to have distinctly separate portions positioned at both said one longitudinal end and the other longitudinal end of the MR element.

16. The magnetic head as claimed in claim 13, wherein each of said magnetic domain stabilizers comprises two separate stabilizer members that are constructed and arranged so that the distinctly separate portions are not connected to any other such portion.

17. The magnetic head as claimed in claim 13, wherein the electrical resistance of the magnetic domain stabilizers is greater than that of the MR element.

18. The magnetic head as claimed in claim 13, wherein an insulating layer is positioned between each of said magnetic domain stabilizers and the MR element.

19. The magnetic head as claimed in claim 13, wherein at least one of the first electrode and the second electrode is not in contact with the magnetic domain stabilizers.

20. The magnetic head as claimed in claim 13, wherein an insulating layer is positioned and arranged on a lower surface of the MR element, between each of the magnetic domain stabilizers and lateral surfaces of the MR element and on an upper surface of each of the magnetic domain stabilizers.

* * * * *